United States Patent
Masich et al.

(10) Patent No.: US 10,804,793 B2
(45) Date of Patent: Oct. 13, 2020

(54) VARIABLE ZERO VOLTAGE SWITCHING (ZVS) HYBRID CONTROLLER FOR POWER FACTOR CORRECTOR (PFC)

(71) Applicant: Lear Corporation, Southfield, MI (US)

(72) Inventors: Antonio Leon Masich, Valls (ES);
Rafael Jimenez Pino, Valls (ES);
Oscar Lucia Gil, Saragossa (ES);
Hector Sarnago Andia, Olvega (ES);
Alejandro Naval Palleres, Barbastro (ES)

(73) Assignee: Lear Corporation, Southfield, MI (US)

( * ) Notice: Subject to any disclaimer, the term of this patent is extended or adjusted under 35 U.S.C. 154(b) by 127 days.

(21) Appl. No.: 16/224,214

(22) Filed: Dec. 18, 2018

(65) Prior Publication Data

US 2020/0195131 A1 Jun. 18, 2020

(51) Int. Cl.
| | |
|---|---|
| *H02J 7/00* | (2006.01) |
| *H02M 1/42* | (2007.01) |
| *B60L 53/22* | (2019.01) |
| *H03K 3/037* | (2006.01) |
| *H02J 7/04* | (2006.01) |
| *H02J 7/02* | (2016.01) |
| *H02M 1/00* | (2006.01) |

(52) U.S. Cl.
CPC .......... *H02M 1/4241* (2013.01); *B60L 53/22* (2019.02); *H02J 7/045* (2013.01); *H03K 3/0377* (2013.01); *H02J 7/022* (2013.01); *H02M 2001/0058* (2013.01)

(58) Field of Classification Search
CPC ....... H02M 3/3376; H02M 2001/0074; H02M 3/285; H02M 3/335; H02M 3/00; H02M 7/1623; H02M 7/48; H02J 50/12; H02J 50/80; H02J 2310/48; H02J 7/00712; H02J 7/025; H02J 2207/20; H02J 5/005; H02J 7/02; H02J 7/022; H02J 7/045; H03K 5/1536; H05B 47/185; H05B 45/10
USPC ................................................ 320/158–162
See application file for complete search history.

(56) References Cited

U.S. PATENT DOCUMENTS

| | | | |
|---|---|---|---|
| 6,611,130 | B2 | 8/2003 | Chang |
| 6,949,915 | B2 | 9/2005 | Stanley |
| 8,233,298 | B2 | 7/2012 | Jang et al. |
| 8,649,189 | B2 | 2/2014 | Tang et al. |
| 8,717,789 | B2 | 5/2014 | Tan et al. |
| 8,829,865 | B2 | 9/2014 | Domb |

(Continued)

*Primary Examiner* — Binh C Tat
(74) *Attorney, Agent, or Firm* — Brooks Kushman P.C.

(57) ABSTRACT

A power factor corrector (PFC), such as for an on-board charger (OBC) for charging a vehicle traction battery, uses an input voltage and an input current from a power source to output a desired voltage. The PFC has an inductor and first and second power switches. A micro-controller generates, for each half-cycle of the input voltage, first and second reference signals respectively indicative of (i) a sinusoidal envelope of the inductor current for which the PFC will absorb sufficient power from the power source for the PFC to output the desired voltage and (ii) a reverse value of the inductor current for which zero voltage switching (ZVS) of the switches is ensured. A comparator assembly turns the first switch off (on) and the second switch on (off) upon the inductor current equaling the outer sinusoidal amplitude envelope (the reverse value) whereby the PFC outputs the desired voltage with ZVS.

20 Claims, 3 Drawing Sheets

(56) References Cited

U.S. PATENT DOCUMENTS

| | | | |
|---|---|---|---|
| 8,971,075 B2 | 3/2015 | Ye et al. | |
| 9,019,735 B2 | 4/2015 | Jeong et al. | |
| 10,381,915 B1* | 8/2019 | Dusmez | H02M 1/4233 |
| 2003/0095421 A1* | 5/2003 | Kadatskyy | H02M 3/1584 |
| | | | 363/65 |
| 2006/0267561 A1 | 11/2006 | Domb et al. | |
| 2013/0033240 A1 | 2/2013 | Ye | |
| 2016/0243952 A1 | 8/2016 | Lasagni | |
| 2017/0302176 A1* | 10/2017 | Leong | H02M 3/156 |

* cited by examiner

VARIABLE ZERO VOLTAGE SWITCHING (ZVS) HYBRID CONTROLLER FOR POWER FACTOR CORRECTOR (PFC)

TECHNICAL FIELD

The present invention relates to methods and systems for controlling power factor correctors (PFCs) such as a PFC of an on-board charger (OBC).

BACKGROUND

The "power factor" of an electrical system having a power source and a load is the ratio of real power delivered to the load divided by apparent power in the electrical system. The power factor depends on a phase difference between a voltage and a current delivered to the load and the current distortion. The power factor is unity when the voltage and the current are sinusoidal and in phase.

Efficiency of the electrical system in powering the load is maximized when the power factor is unity. The electrical system may therefore include a power factor corrector (PFC). The PFC is controlled to regulate the current to be more in phase with the voltage to thereby increase the power factor towards unity to fulfill EMC standards and maximize the efficiency.

SUMMARY

A power factor corrector (PFC) assembly includes a PFC, a micro-controller, and a hysteretic comparator circuit assembly. The PFC is to use an input voltage and an input current from a power source to output a desired voltage. The PFC has an inductor, a first power switch, and a second power switch. The input current is a current of the inductor and the inductor current depends on switching status of the power switches.

The micro-controller is configured to generate, based on the input voltage and the desired voltage, a first reference signal (Ref_H) and a second reference signal (Ref_L). The first reference signal (Ref_H) during positive half-cycles of the input voltage is indicative of an outer sinusoidal amplitude envelope of the inductor current for which the PFC will absorb a sufficient amount of power from the power source for the PFC to output the desired voltage and has a sinusoidal value that is in proportion to the sufficient amount of power and that is offset by a zero voltage switching (ZVS) offset value. The ZVS offset value is a value of reverse current in the inductor for which zero voltage switching of the power switches is ensured. The first reference signal (Ref_H) during negative half-cycles of the input voltage has the negative ZVS offset value. The second reference signal (Ref_L) during positive half-cycles of the input voltage has the ZVS offset value and during negative half-cycles of the input voltage has the negative sinusoidal value.

The hysteretic comparator circuit assembly is configured to compare the inductor current with the first and second reference signals, turn the first power switch off and the second power switch on upon the inductor current equaling the second reference signal and to turn the first power switch on and the second power switch off upon the inductor current equaling the first reference signal whereby the PFC outputs the desired voltage with zero voltage switching of the power switches.

In an embodiment, the hysteretic comparator circuit assembly includes a first comparator and a second comparator. The first comparator receives the first reference signal and a sensed value of the inductor current as inputs and switches its output upon the inductor current equaling the first reference signal. The second comparator receives the second reference signal and the sensed value of the inductor current as inputs and switches its output upon the inductor current equaling the second reference signal.

In an embodiment, the hysteretic comparator circuit assembly may further include a digital flip-flop circuit and a digital driver circuit which function with the outputs of the first comparator and the second comparator to maintain the first power switch off and the second power switch on until the inductor current equals the first reference signal and to maintain the first power switch on and the second power switch off until the inductor current equals the second reference signal.

An on-board charger (OBC) for charging a traction battery of a vehicle includes a DC link capacitor and the PFC assembly. The PFC assembly uses an input voltage and an input current from an AC mains supply to charge the DC link capacitor to a desired voltage level.

In an embodiment, the micro-controller is associated with first, second, and third signal conditioners. The first signal conditioner is in communication with an input side of the PFC and senses the input voltage, the second signal conditioner is communication with a measuring resistor in series with the inductor and senses the inductor current, and the third signal conditioner senses a voltage of the DC link capacitor. Generally, the micro-controller processes the sensed voltage of the DC link capacitor, the sensed input voltage, and the desired voltage level of the DC link capacitor to generate the first reference signal and the second reference signal.

More particularly, the micro-controller generates each of the first reference signal and the second reference signal by (i) determining a voltage difference of the desired voltage of the DC link capacitor and the sensed voltage of the DC link capacitor, (ii) proportional integrating the voltage difference to generate a desired input current value, and (iii) multiplying the desired input current value and the sensed input voltage to generate a power signal indicative of the sufficient amount of power to be absorbed from the mains supply by the PFC for the PFC to charge the DC link capacitor to the desired voltage level.

In an embodiment, the micro-controller is associated with a zero-crossing detector (ZCD) configured to generate a zero-crossing signal when the input voltage crosses zero volts. The first reference signal and the second reference signal are further generated based on the zero-crossing signal.

The micro-controller may be pre-configured with a magnitude of the reverse value of the inductor current.

The OBC may further include a DC/DC converter to convert the desired voltage level of the DC link capacitor to a higher or lower voltage level and to charge the traction battery.

DETAILED DESCRIPTION

Detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

Figure 1:
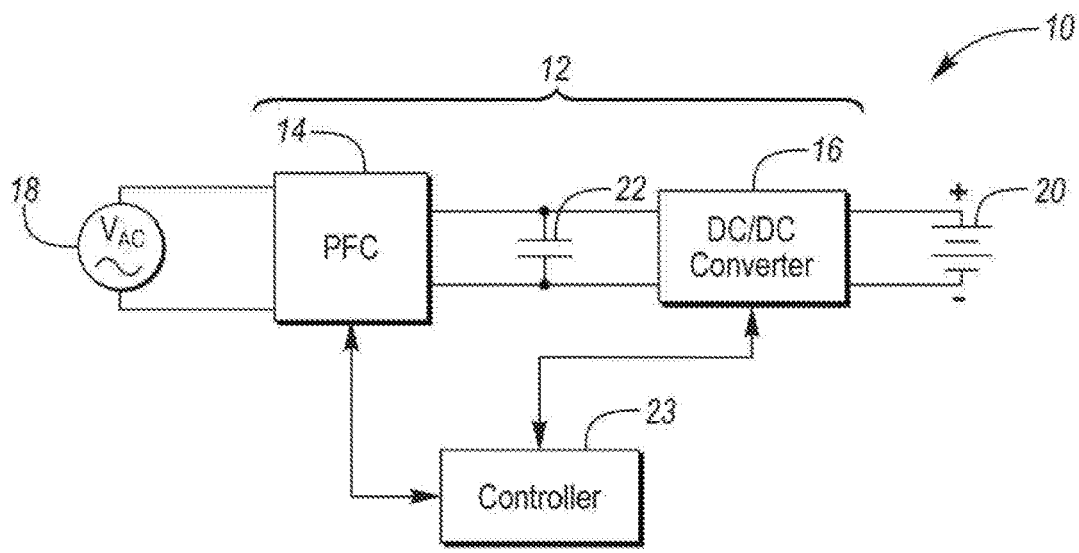
FIG. 1 illustrates a block diagram of an electrical system having an on-board charger (OBC) including a power factor corrector (PFC), a DC link capacitor, and a DC/DC converter.

Referring now to FIG. 1, a block diagram of an electrical system 10 having an on-board charger (OBC) 12 is shown. OBC 12 includes a power factor corrector (PFC) 14 and a DC/DC converter 16. ("DC" stands for direct current.) Electrical system 10 further includes an AC power source such as a mains supply 18 of the electrical grid. ("AC" stands for alternating current.)

OBC 12 is for use "on-board" a hybrid or electric vehicle having a traction battery 20. Traction battery 20 is a load of electrical system 10. OBC 12 charges traction battery 20 using AC electrical energy from mains supply 18. OBC 12 has an input which connects to mains supply 18 by an external Electric Vehicle Supply Equipment (EVSE) (not shown) to receive AC electrical power from the mains supply. OBC 12 has an output which connects to traction battery 20. OBC 12 converts AC electrical power from mains supply 18 into DC electrical power and provides the DC electrical power to traction battery 20 for charging the traction battery.

PFC 14 and DC/DC converter 16 are cascaded stages of OBC 12. OBC 12 further includes a DC link capacitor 22 between PFC 14 and DC/DC converter 16. PFC 14 converts AC electrical power from mains supply 18 into DC electrical power and delivers the DC electrical power to DC link capacitor 22 while keeping the power factor close to unity. PFC 14 is controlled so that the voltage of DC link capacitor 22 is regulated at a desired DC voltage level. The voltage of DC link capacitor 22 is the input voltage of DC/DC converter 16. DC/DC converter 16 converts the input voltage to a higher/lower DC voltage level according to the battery charge status. This DC voltage level is the output voltage of DC/DC converter 16. Traction battery 20 (i.e., a high-voltage ("HV") battery) is charged to the output voltage of DC/DC converter 16.

As described, PFC 14 is the grid front-end and DC/DC converter 16 adapts output to the HV battery range. Particularly, PFC 14 is used to control the current absorbed from mains supply 18 and to control the DC link voltage. DC/DC converter 16, connected in series with PFC 14, regulates the charging current delivered to traction battery 20 from the DC link stage. The efficiency of OBC 12 in charging traction battery 20 is maximized when the power factor is unity. As the power factor deviates from unity, meeting EMC standards is compromised, and more power losses accrue. Power losses result in thermal heat generation. OBCs typically target efficiencies of at least 95% to avoid the use of sophisticated thermal management systems for dissipating the generated losses. The overall efficiency of OBC 12 is a function of the efficiencies achieved by PFC 14 and DC/DC converter 16.

OBC 12 further includes a controller 23. Controller 23 is an electronic device such as a processor, micro-controller, or the like (e.g., a computer). Controller 23 is in communication with PFC 14 and DC/DC converter 16 to control operations of the PFC and the DC/DC converter. For instance, controller 23 controls PFC 14 in converting AC electrical power from mains supply 18 into DC electrical power and delivering the DC electrical power to DC link capacitor 22. In this regard, controller 23 appropriately controls the switching and switching duration of power transistor switches 28 (shown in FIG. 2) of PFC 14 to control the power factor correction provided by the PFC and the operation of the PFC in delivering a selected amount of DC electrical power, converted from AC electrical power of mains supply 18, to DC link capacitor 22. In this way, DC link capacitor 22 is regulated at the desired DC voltage level.

Controller 23 controls DC/DC converter 16 in converting the DC input voltage from DC link capacitor 22 to a higher DC output voltage for charging traction battery 20. In this regard, controller 23 appropriately controls the switching and switching duration of power transistor switches (not shown) of DC/DC converter 16 for the DC/DC converter to convert the input voltage into a higher output voltage. Controller 23 is also operable to communicate and control other nodes of electrical system 10 and the vehicle including nodes involved in the charging applications.

Mains supply 18 may be a single, dual, or three-phase mains supply. As such, AC mains voltage may be a single, dual, or three-phase AC mains voltage. For simplicity, mains supply 18 is assumed to be a single-phase mains supply. As such, OBC 12 is described herein as having a single set of PFC 14 and DC/DC converter 16. In the case of AC mains voltage being a dual-phase (three-phase) AC mains voltage, OBC 12 would include two (three) sets of PFC 14 and DC/DC converter 16, respectively, for the two (three) phases.

Figure 2:
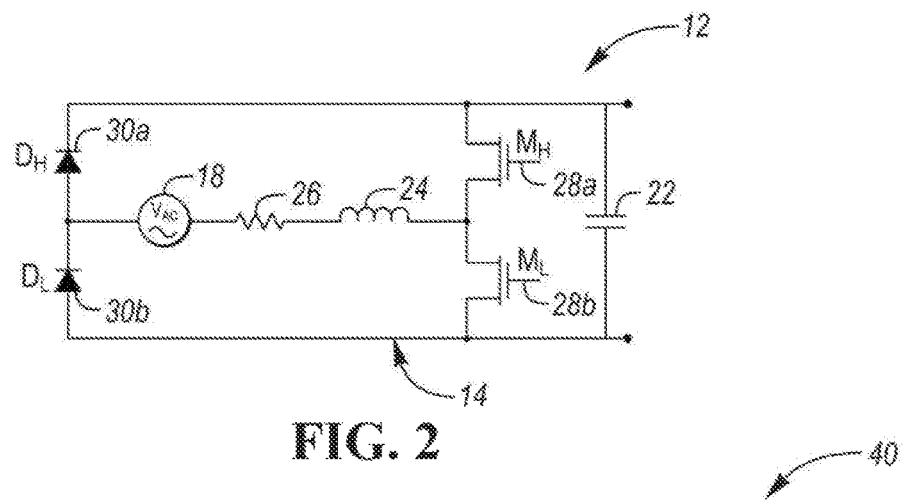
FIG. 2 illustrates an electrical schematic diagram of the PFC.

Referring now to FIG. 2, with continual reference to FIG. 1, an electrical schematic diagram of PFC 14 is shown. As illustrated in FIG. 2, PFC 14 has a totem-pole, basic cluster structure known by those of ordinary skill in the art. PFC 14 is illustrated as only having one such structure. However, interleaving of more structures is feasible and recommended to share current on the different totem-poled branches.

PFC 14 draws an input current from mains supply 18 to convert AC electrical power from the mains supply into DC electrical power for DC link capacitor 22. PFC 14 includes an inductor 24 and a measuring resistor 26. Inductor 24 and measuring resistor 26 are in series with the input to mains supply 18. The current of inductor 24 ("the inductor current") is the input current drawn from mains supply 18. Controller 23 is in communication with measuring resistor 26 to sense the value of the inductor current.

PFC 14 further includes a first power transistor switch 28a ($M_H$) and a second power transistor switch 28b ($M_L$) ("power switches 28"). Power switches 28 form the "totem-pole" of the structure of PFC 14 as one switch is on top of the other switch. PFC 14 further includes diodes 30a and 30b ("diodes 30"). Diodes 30 alternatively conduct depending on whether the voltage of mains supply 18 is greater than or less than zero. Particularly, diode 30a conducts while the voltage of mains supply 18 is greater than zero, which occurs during each positive half-cycle of the mains supply. Diode 30b conducts while the voltage of mains supply 18 is less than zero, which occurs during each negative half-cycle of the mains supply.

Controller 23 alternately turns power switches 28 on-and-off with corresponding pulse width durations during the positive and negative half-cycles of mains supply 18 for PFC 14 to function as a synchronous boost converter in converting AC electrical power from the mains supply into DC electrical power for DC link capacitor 22 while providing power factor correction.

Figure 3A:
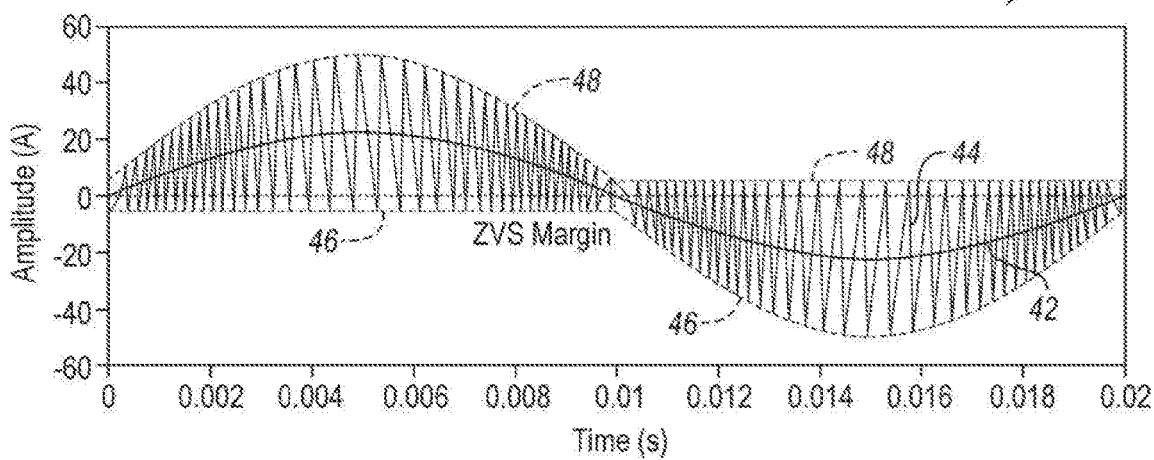
FIG. 3A illustrates a graph having plots of the current of a mains supply of the electrical system, the current of an inductor of the PFC, and ref_L and ref_H waveforms, which are generated by a controller of the electrical system, during one cycle of the mains supply.
Figure 3B:
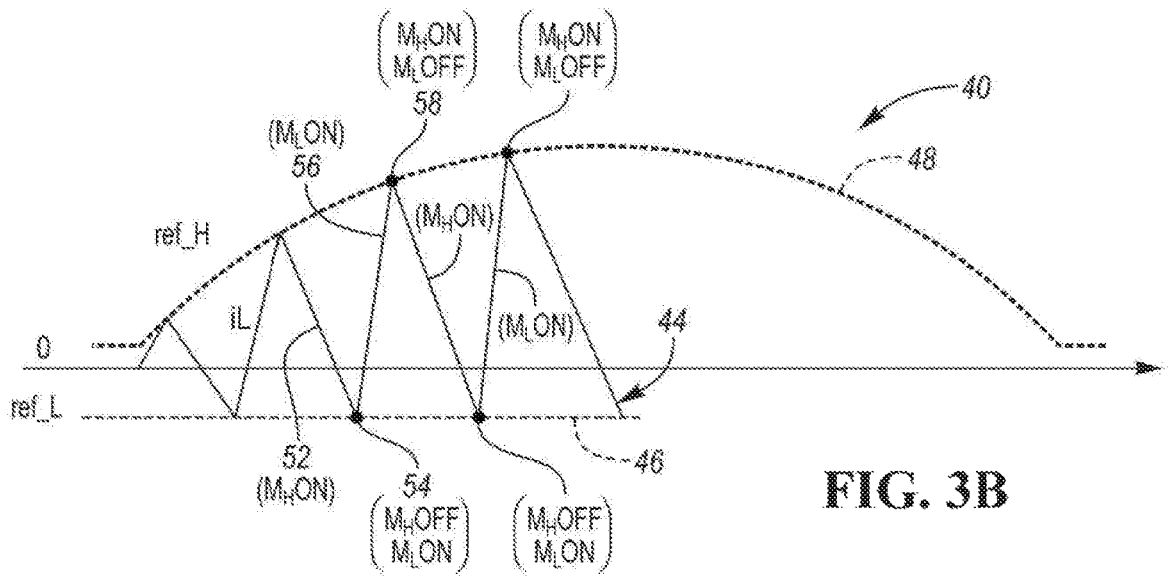
FIG. 3B illustrates an enlarged portion of the graph shown in FIG. 3A during the positive half-cycle of the mains supply.

Referring now to FIGS. 3A and 3B, with continual reference to FIGS. 1 and 2, a graph 40 for one cycle of mains supply 18 and an enlarged portion of graph 40 during the positive half-cycle of the one cycle are respectively shown. Graph 40 includes a plot of a desired input current ($i_{ac}$) 42 from mains supply 18 and a plot of the inductor current ($i_L$) 44 over time during the one cycle.

The plot of desired input current 42 from mains supply 18 is shown for reference. Mains supply 18 is a sinusoidal power source having a frequency of, for example, 50 Hz. Thus, desired input current 42 is sinusoidal and has the frequency of 50 Hz. Based on a frequency of 50 Hz, the duration of the one cycle is 0.02 seconds as depicted in graph 40.

Inductor current 44 is composed of triangular current waveforms. The triangular current waveforms oscillate at a much higher frequency than the frequency of desired input current 42. The triangular current waveforms are generated due to power switches 28 being alternately turned on-and-off during the operation of PFC 14. Controller 23 alternately turns on-and-off power switches 28 with corresponding pulse width durations so that inductor current 44 is such that desired input current 42 is the root mean square (RMS) of the inductor current.

As shown in FIG. 3A, the triangular current waveforms of inductor current 44 penetrate the negative current area during the positive half-cycle of mains supply 18 (best shown in FIG. 3B) and penetrate the positive current area during the negative half-cycle of the mains supply. Controller 23 controls the switching of power switches 28 so that the triangular current waveforms penetrate to a desired magnitude the negative (positive) current area during the positive (negative) half-cycle.

The triangular current waveforms of inductor current 44 are to penetrate the negative (positive) current areas during the positive (negative) half-cycles to the desired magnitude for zero voltage switching (ZVS) of power switches 28 to occur. For example, the desired magnitude during the positive half-cycle is about −5A as indicated in FIG. 3A and the desired magnitude during the negative half-cycle is about +5A as indicated in FIG. 3A. Thus, the "ZVS margin", labeled in graph 40, during the positive (negative) half-cycle is 5A below (above) the zero-current value of 0A. The zero-current value is the x-axis in graph 40.

ZVS refers to switching a power switch 28 on while the voltage across the power switch is zero or at least about zero. In this way, the overlay of the voltage across the power switch and the current through the power switch is minimal, thereby resulting in minimal switching power losses. The voltage across a power switch 28 being zero happens at some point while the triangular current waveforms of inductor current 44 are in the ZVS margin. The desired magnitude of the ZVS margin is pre-determined. The desired magnitude is a magnitude in which the voltage across a power switch 28 will be zero when the triangular current waveforms penetrate to that magnitude.

Graph 40 further includes a plot of a ref_L waveform 46 and a ref_H waveform 48 during the one cycle of mains supply. As described in greater detail herein, controller 23 generates ref_L waveform 46 and ref_H waveform 48. Ref_L waveform 46 defines the ZVS margin during positive half-cycles of mains supply and ref_H waveform 48 defines the ZVS margin during negative half-cycles of mains supply. Ref_H waveform 48 defines an outer envelope at which inductor current 44 is twice desired input current 42 during positive half-cycles of mains supply and ref_L defines the outer envelope during negative half-cycles of mains supply.

More particularly, during positive half-cycles of mains supply (i.e., during positive half-cycles of the input voltage), ref_H waveform 48 is indicative of an outer sinusoidal amplitude envelope of the inductor current for which PFC 14 will absorb a sufficient amount of power from mains supply 18 for the PFC to output the desired voltage and has a sinusoidal value that is in proportion to the sufficient amount of power and is offset by a zero voltage switching (ZVS) offset value. The ZVS offset value is a value of reverse current in the inductor for which zero voltage switching of power switches 28 is ensured. Ref_H waveform 48 has the negative ZVS offset value during negative half-cycles of mains supply 18. Ref_L waveform 46 has the ZVS offset value during positive half-cycles of mains supply 18 and has the negative sinusoidal value during negative half-cycles of mains supply 18.

In sum, during the positive mains half-cycle:

Ref_H=(sinusoidal(proportional to Po))+ZVSoffset

Ref_L=−ZVSoffset and during negative mains half-cycle:

Ref_H=ZVSoffset

Ref_L=(−sinusoidal(proportional to Po))−ZVSoffset where "Po" is the sufficient amount of power to be absorbed from mains supply 18 by PFC 14 for the PFC to output the desired voltage and "ZVSoffset" is the ZVS offset value (i.e., the ZVS margin).

ZVS is achieved by means of the turn-on transition of power switches 28 ensuring the parasitic capacitance discharge (ref_L waveform 46 during positive half-cycles and ref_H waveform during negative half cycles) and turning off power switches 28 when inductor current 44 is twice desired input current 42 to absorb the selected power and control the DC link voltage to the desired voltage level (ref_H waveform 48 during positive half cycles and ref_L waveform during negative half cycles).

For example, with reference to FIG. 3B, which involves the positive half-cycle of mains supply 18, controller 23 controls power switch 28a ($M_H$) to be on and power switch 28b ($M_L$) to be off such that inductor current 44 has the form of current segment 52. Subsequently, upon current segment 52 equaling the desired magnitude of the ZVS margin at point 54, controller 23 controls power switch 28a ($M_H$) to be off and power switch 28b ($M_L$) to be on. That is, upon inductor current 44 meeting ref_L waveform 46 at point 54, controller 23 controls power switch 28a ($M_H$) to be off and power switch 28b ($M_L$) to be on. Inductor current 44 then has the form of current segment 56. Subsequently, upon current segment 56 being twice desired input current 42 at point 58, controller 23 controls power switch 28a ($M_H$) to be on and power switch 28b ($M_L$) to be off. That is, upon inductor current 44 meeting ref_H waveform 48 at point 58, controller 23 controls power switch 28a ($M_H$) to be on and power switch 28b ($M_L$) to be off. This process repeats as controller 23 controls power switch 28a ($M_H$) to be off and power switch 28b ($M_L$) to be on upon inductor current 44 being the desired magnitude of the ZVS margin and controls power switch 28a ($M_H$) to be on and power switch 28b ($M_L$) to be off upon inductor current 44 being twice desired input current 42.

Figure 4:
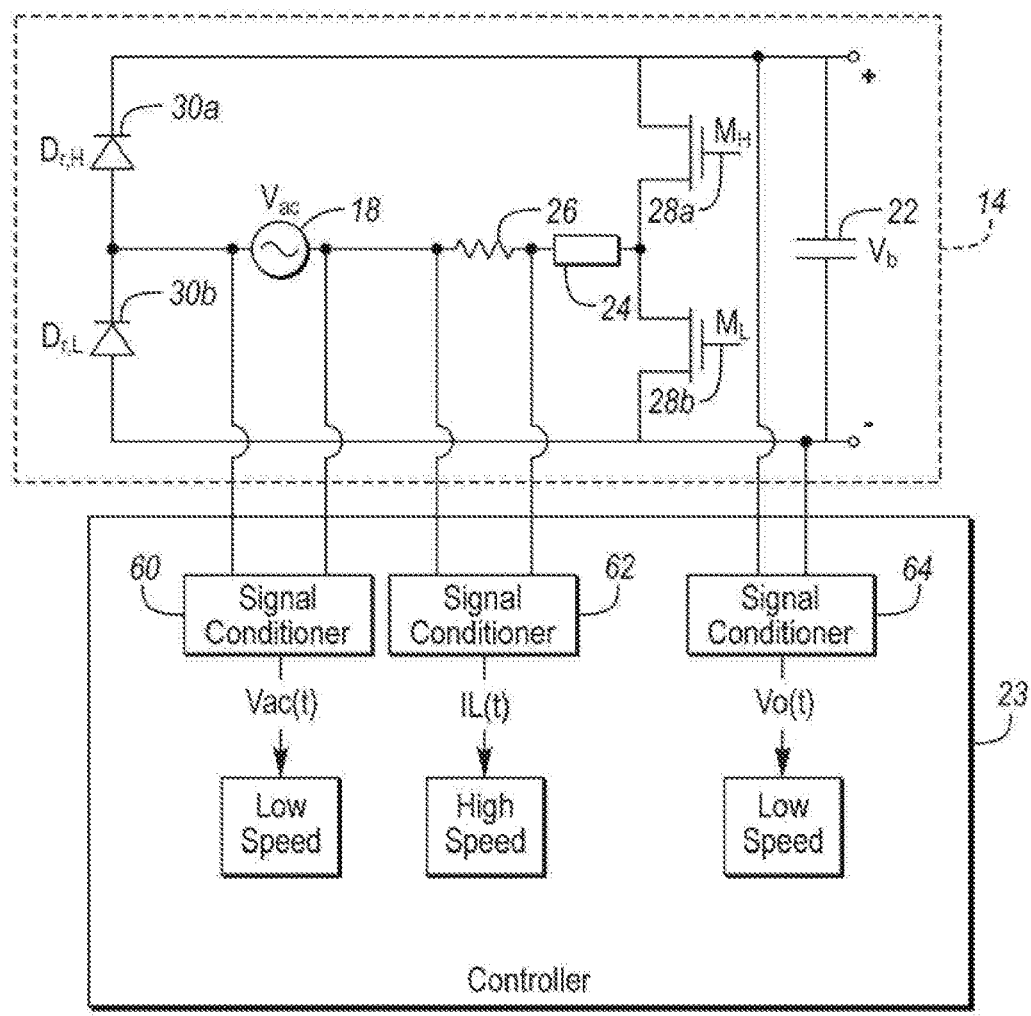
FIG. 4 illustrates a block diagram of the mains PFC stage and its sensed signals.

Referring now to FIG. 4, with continual reference to FIGS. 1, 2, 3A, and 3B, a block diagram of the mains PFC stage and its sensed signals is shown. Controller 23 monitors the sensed signals. In this regard, controller 23 includes first, second, and third signal conditioners 60, 62, and 64. First signal conditioner 60 is in communication with the input side of OBC 12 and senses the input voltage (Vac(t)) of mains supply 18. Second signal conditioner 62 is communication with measuring resistor 26 to monitor the current flowing through the measuring resistor. As inductor 24 is in series with measuring resistor 26, the current flowing through the measuring resistor is inductor current 44. Second signal conditioner 62 thereby senses inductor current (iL(t)) 44. Third signal conditioner 64 senses the voltage (Vo(t)) of DC link capacitor 22.

Figure 5:
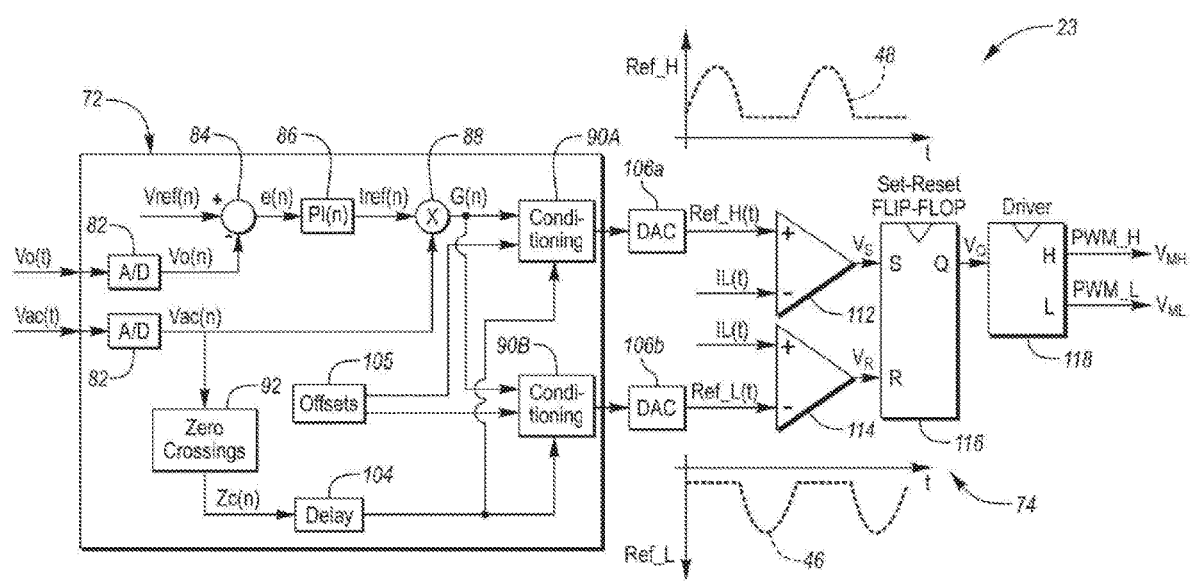
FIG. 5 illustrates a block diagram schematic of the controller which includes a micro-controller and a hysteretic comparator circuit assembly.

Referring now to FIG. 5, with continual reference to FIGS. 1, 2, 3A, 3B, and 4, a block diagram of controller 23 is shown. As shown in FIG. 5, controller 23 includes a micro-controller 72 and a hysteretic comparator circuit assembly ("comparator assembly") 74. Controller 23 is thus a "hybrid controller".

To improve the overall efficiency of OBC 12, which is a function of the efficiencies achieved by PFC 14 and DC/DC converter 16, controller 23 controls the operation of the PFC via zero-voltage techniques so that mitigation of losses of the PFC is obtained. As such, PFC operation under ZVS conditions is a focus of controller 23.

In this regard, micro-controller 72 functions to generate ref_L waveform 46 (i.e., ZVS margin for the positive half-cycles of mains supply 18 and the outer envelope of inductor current 44 for the negative half-cycles of the mains supply) and ref_H waveform 48 (i.e., the outer envelope of inductor current 44 for the positive half-cycles of the mains supply and the ZVS margin for the negative half-cycles of the mains supply). Micro-controller 72 generates ref_L waveform 46 and ref_H waveform 48 based on the input current and the desired voltage level of DC link capacitor 22. Particularly, micro-controller 72 processes the sensed voltage (Vo(t)) of DC link capacitor 22, the sensed input voltage (Vac(t)) of mains supply 18, and a desired voltage level (Vref(n)) of DC link capacitor 22 to generate the outer envelope of inductor current 44 for the positive and negative half-cycles of the mains supply.

In detail, as shown in FIG. 5, micro-controller 72 includes a set of A/D converters 82. A/D converters 82 respectively receive analog signals indicative of the sensed input voltage (Vac(t)) of mains supply 18 and the sensed voltage (Vo(t)) of DC link capacitor 22. A/D converters 82 respectively convert these analog signals into digital signals. Micro-controller 72 determines at summer 84 a voltage difference (e(n)) between the digitized signals (V(ref(n)) and Vo(n)) of the desired and sensed voltages of DC link capacitor 22; (ii) proportional integrates at proportional integrator 86 the voltage difference (e(n)) to generate a desired input current value (Iref(n)); and (iii) multiply at multiplier 88 the desired input current value (Iref(n)) and the sensed input voltage of mains supply 18 to generate a power signal (G(n)). The power signal (G(n)) is indicative of the power to be absorbed by PFC 14 from mains supply 18 for the PFC to cause DC link capacitor 22 to have the desired voltage level (Vref(t)). The power signal (G(n)) is provided to each of two signal conditioners 90a and 90b.

Micro-controller 72 further includes a ZVS offset generator 105. ZVS offset generator 105 generates a digited value of the ZVS offset. ZVS offset generator 105 generates the ZVS offset from experience (i.e., a table). ZVS offset generator 105 provides the digitized value of the ZVS offset to each of the two signal conditioners 90a and 90b.

Micro-controller 72 further includes a zero-crossing detector (ZCD) 92. ZCD 92 monitors the sensed input voltage (Vac(t)) of mains supply 18 and generates a zero-crossing (ZC) signal when the input voltage (Vac(t)) crosses zero volts. Each digital zero-crossing signal (Zc(n)) generated by ZCD 92 is provided, via a delay 104 (discussed in detail below), to each of the two signal conditioners 90a and 90b.

Each signal conditioner 90a and 90b thus receives the power signal (G(n)), the digitized value of the ZVS offset, and the zero-crossing signal (Zc(n)). First signal conditioner 90a processes these signal inputs to generate a digitized version of Ref_H waveform 48. The digitized version of Ref_H waveform 48 is provided to a first digital-to-analog (DAC) converter 106a. First DAC converter 106a generates (analog) ref_H waveform 48 from the digitized version of Ref_H waveform 48. Similarly, second signal conditioner 90b processes these signal inputs to generate a digitized version of Ref_L waveform 46. The digitized version of Ref_L waveform 46 is provided to a second DAC converter 106b. Second DAC converter 106b generates (analog) ref_L waveform 46 from the digitized version of Ref_L waveform 46. In this way, the zero crossing signal controls the conditioned outputs delivered to the DAC converters 106.

Comparator assembly 74 functions to generate control (i.e., trigger) signals for alternately switching power switches 28 on-and-off. Comparator assembly 74 generates the control signals based on a comparison of inductor current 44 with both ref_L waveform 46 and ref waveform 48. For instance, with reference to FIG. 3B, upon the value of inductor current 44 equaling the value of ref_L waveform 46 (such as at point 54 in FIG. 3B), comparator assembly 74 generates control signals to turn first power switch 28a ($M_H$) off and to turn second power switch 28b ($M_L$) on. Upon the value of inductor current 44 equaling the value of ref_H waveform 48 (such as at point 58 in FIG. 3B), comparator assembly 74 generates control signals to turn first power switch 28a ($M_H$) on and to turn second power switch 28b ($M_L$) off.

In detail, as shown in FIG. 5, comparator assembly 74 includes first and second analog comparator circuits 112 and 114, a digital flip-flop circuit 116, and a digital driver circuit 118. First comparator 112 receives ref_H waveform 48 and the sensed value of inductor current (iL(t)) 44 as inputs. Second comparator 114 receives ref_L waveform 46 and the sensed value of inductor current (iL(t)) 44 as inputs. First comparator 112 switches its output upon the value of inductor current 44 equaling the value of ref_H waveform 48 (i.e., upon the value of inductor current being the value of the outer amplitude envelope). Second comparator 114 switches its output upon the value of inductor current 44 equaling the value of ref_L waveform 46 (i.e., upon the value of inductor current 44 being the value of the desired magnitude of the ZVS margin).

Flip-flop circuit 116 and driver circuit 118 function accordingly for pulse width modulated (PWM) control signals to be provided to power switches 28. The PMW control signals provide that first power switch 28a ($M_H$) is turned off and second power switch 28b ($M_L$) is turned on upon inductor current 44 equaling ref_L waveform 46 and first power switch 28a ($M_H$) stays off and second power switch 28b ($M_L$) stays on until inductor current 44 equals ref_H waveform 48. Likewise, the PWM control signals provide that first power switch 28a ($M_H$) is turned on and second power switch 28b ($M_L$) is turned off upon inductor current 44 equaling ref_H waveform 48 and first power switch 28a ($M_H$) stays on and second power switch 28b ($M_L$) stays off until inductor current 44 equals ref_L waveform 46.

Micro-controller 72 may be relatively low cost at it generates a digital external slow loop (i.e., ref_L waveform 46 and ref_H waveform 48). Comparator assembly 74 is a low-cost, analog fast-current control loop with variable ZVS transition. The fast-current control loop ensures a required amount of reverse current ($i_R$) in inductor 24 that can discharge totally the main FET parasitic capacitance of the corresponding power switch 28. Moreover, micro-controller 72 controls this reverse current, according to the power plant, to achieve always the ZVS condition independently of the FET characteristic. In this regard, for the positive half-cycles, micro-controller 72 generates ref_L waveform 46 (the magnitude of the reverse current ($i_R$)) and ref_H waveform 48 (the external slow loop used to control the DC link voltage) and for the negative half-cycles, micro-controller 72 generates ref_L waveform 46 (the external slow loop used to control the DC link voltage) and ref_H waveform 48 (the magnitude of the reverse current ($i_R$)).

In sum, micro-controller 72 generates reference signals, ref_L waveform 46 and ref_H waveform 48, based on the input current and the desired DC link voltage and comparator assembly 74 (i.e., hardware) controls the switching of power switches 28 based on a comparison of the inductor current with the reference signals. In this way, micro-controller 72 allocates a high-level software control loop that generates waveform inputs to hardware circuitry (i.e., comparator assembly 74) according to the mains profile (i.e., according to ref_L waveform 46 and ref_H waveform 48). Comparator assembly 74 turns on and off power switches 28 in the selected levels thereby always achieving the ZVS.

In further detail, micro-controller 72 generates the low frequency reference signals, ref_L waveform 46 and ref_H waveform 48, to control PFC 14. Micro-controller 72 generates ref_L waveform 46 and ref_H waveform 48 to achieve the desired output power with sinusoidal input current consumption and to achieve ZVS switching for high efficiency operation.

As an example, with reference to FIG. 3B which pertains to a positive mains half-cycle, micro-controller 72 generates ref_H waveform 48 following a sinusoidal shape whose amplitude is determined by the desired output power (i.e., the selected DC link voltage) and generates ref_L waveform 46 to achieve a certain negative current value to ensure ZVS. As described, to generate the control signals for power switches 28, the reference signals (ref_L waveform 46 and ref_H waveform 48) are compared with inductor current 44.

As indicated above, each digital zero-crossing signal (Zc(n)) generated by ZCD 92 of micro-controller 72 is provided to each of the two signal conditioners 90a and 90b via a delay 104 of the micro-controller. In this regard, there may be an input filter (not shown) to PFC 14 which may generate a harmonic distortion. This means that a phase difference will be between the input voltage and the input current. As such, the input current may be distorted due to phase lag introduced by the input filter. Delay 104 is provided to eliminate this phase difference in the generation of ref_L waveform 46 and ref_H waveform 48. Delay 104 is generated from experience (i.e., tables). Delay 104 is provided to signal conditioners 90a and 90b to phase-shift ref_L waveform 46 and ref_H waveform 48.

Unlike conventional approaches, micro-controller 72 does not directly measure, perform control action, and generate control signals, thereby avoiding high resource utilization and timing constraints. That is, micro-controller 72 does not calculate the vertices at which inductor current 44 will meet ref_L waveform 46 or ref_H waveform 48. Micro-controller 72 thereby does not generate control signals for controlling power switches 28. As the vertices occur relatively rapidly, as can be seen in FIGS. 3A and 3B, such control signals would require processing on the order of nanoseconds. Instead of generating such control signals, micro-controller 72 generates ref_L waveform 46 and ref_H waveform 48. The generation of ref_L waveform 46 and ref_H waveform 48 employs processing on the order of milliseconds. Accordingly, micro-controller 72 functions at a relatively low speed (e.g., milliseconds) instead of operating at a relatively high speed (e.g., nanoseconds).

A fast inductor current digitizing circuit to detect zero crossings of inductor current 44 would be needed for micro-controller 72 to generate control signals for controlling power switches 28. Like the vertices, zero crossings of inductor current 44 occur relatively rapidly, as can be seen in FIGS. 3A and 3B. Processing of detected zero crossings of inductor current 44 would thus require fast analog-to-digital conversion. As micro-controller 72 does not generate the control signals for controlling power switches 28, no fast inductor current digitizing circuit and no fast analog-to-digital conversion is required. The control architecture of micro-controller 72 is simplified as the micro-controller does not have any fast control action related to inductor current zero crossing signals. PFC fast control tasks are externalized and implemented using inexpensive components (i.e., comparator assembly 74), thereby simplifying the overall control architecture.

Advantages of controller 23 include a novel ZVS approach which enables high performance product feasibility and flexibility due to mixed implementation (hardware/software). The "hybrid" aspect of controller 23 does not require high performance MCU/DSP/FPGA to operate PFC in ZVS. Controller 23 is thus a cost effective and less complex system without loss of efficiency, due to its cost-effective and versatile architecture. The hardware portion (i.e., comparator assembly 74) of controller 23 is based on standard and non-expensive devices. As described, a concept employed by controller 23 is real-signal detection, which is more robust and more accurate than predictive systems. Controller 23 can also be exported to other systems based on zero-crossing current detection. As also described, applicability of controller 23 includes battery chargers for HEVs, PHEVs, EVs, and other high-power applications based on ZVS current control.

While exemplary embodiments are described above, it is not intended that these embodiments describe all possible forms of the present invention. Rather, the words used in the specification are words of description rather than limitation, and it is understood that various changes may be made without departing from the spirit and scope of the present invention. Additionally, the features of various implementing embodiments may be combined to form further embodiments of the present invention.

What is claimed is:

1. A power factor corrector (PFC) assembly, comprising:
a power factor corrector (PFC) to use an input voltage and an input current from a power source to output a desired voltage, the PFC having an inductor, a first power switch, and a second power switch, wherein the input current is a current of the inductor and the inductor current depends on switching status of the power switches;

a micro-controller configured to generate, based on the input voltage and the desired voltage, a first reference signal and a second reference signal, wherein the first reference signal during positive half-cycles of the input voltage is indicative of an outer sinusoidal amplitude envelope of the inductor current for which the PFC will absorb a sufficient amount of power from the power source for the PFC to output the desired voltage and has a sinusoidal value that is in proportion to the sufficient amount of power and that is offset by a zero voltage switching (ZVS) offset value, wherein the ZVS offset value is a value of reverse current in the inductor for which zero voltage switching of the power switches is ensured, and the first reference signal during negative half-cycles of the input voltage has the negative ZVS offset value, wherein the second reference signal during positive half-cycles of the input voltage has the ZVS offset value and during negative half-cycles of the input voltage has the negative sinusoidal value; and a hysteretic comparator circuit assembly configured to compare the inductor current with the first and second reference signals and to turn the first power switch off and the second power switch on upon the inductor current equaling the second reference signal and to turn the first power switch on and the second power switch off upon the inductor current equaling the first reference signal whereby the PFC outputs the desired voltage with zero voltage switching of the power switches.

2. The PFC assembly of claim 1 wherein:
the hysteretic comparator circuit assembly includes a first comparator which receives the first reference signal and a sensed value of the inductor current as inputs and switches its output upon the inductor current equaling the first reference signal; and
the hysteretic comparator circuit assembly further includes a second comparator which receives the second reference signal and the sensed value of the inductor current as inputs and switches its output upon the inductor current equaling the second reference signal.

3. The PFC assembly of claim 2 wherein:
the hysteretic comparator circuit assembly further includes a digital flip-flop circuit and a digital driver circuit which function with the outputs of the first comparator and the second comparator to maintain the first power switch off and the second power switch on until the inductor current equals the first reference signal and to maintain the first power switch on and the second power switch off until the inductor current equals the second reference signal.

4. The PFC assembly of claim 1 wherein:
the micro-controller is associated with first, second, and third signal conditioners, wherein the first signal conditioner is in communication with an input side of the PFC and senses the input voltage, the second signal conditioner is communication with a measuring resistor in series with the inductor and senses the inductor current, and the third signal conditioner is in communication with an output side of the PFC and senses an output voltage of the PFC; and
the micro-controller processes the sensed output voltage of the PFC, the sensed input voltage, and the desired voltage to generate each of the first reference signal and the second reference signal.

5. The PFC assembly of claim 4 wherein:
the micro-controller generates each of the first reference signal and the second reference signal by (i) determining a voltage difference of the desired voltage and the sensed output voltage of the PFC, (ii) proportional integrating the voltage difference to generate a desired input current value, and (iii) multiplying the desired input current value and the sensed input voltage to generate a power signal indicative of the sufficient amount of power to be absorbed from the power source by the PFC for the PFC to output the desired voltage.

6. The PFC assembly of claim 5 wherein:
the micro-controller is further associated with a zero-crossing detector (ZCD) configured to generate a zero-crossing signal when the input voltage crosses zero volts, wherein the first reference signal and the second reference signal are further generated based on the zero-crossing signal.

7. The PFC assembly of claim 1 wherein:
the micro-controller is pre-configured with a magnitude of the reverse value of the inductor current.

8. The PFC assembly of claim 1 further comprising:
a DC link capacitor, wherein the DC link capacitor is charged by the PFC to the output voltage of the PFC; and
a DC/DC converter to convert a voltage of the DC link capacitor to a higher or lower voltage level.

9. The PFC assembly of claim 1 wherein:
the first power switch and the second power switch are arranged in a totem-pole configuration with each of the first power switch, the second power switch, and the inductor being connected together at one end.

10. The PFC assembly of claim 1 wherein:
the PFC further has a measuring resistor in series with the inductor; and
the micro-controller is in communication with the measuring resistor to sense the inductor current for the hysteretic comparator circuit assembly to use in comparing the inductor current with the first and second reference signals.

11. An on-board charger for charging a traction battery of a vehicle, comprising:
a DC link capacitor;
a power factor corrector (PFC) to use an input voltage and an input current from an AC mains supply to charge the DC link capacitor to a desired voltage level, the PFC having an inductor, a first power switch, and a second power switch, wherein the input current is a current of the inductor and the inductor current depends on switching status of the power switches;
a micro-controller configured to generate, based on the input voltage and the desired voltage level, a first reference signal and a second reference signal, wherein the first reference signal during positive half-cycles of the input voltage is indicative of an outer sinusoidal amplitude envelope of the inductor current for which the PFC will absorb a sufficient amount of power from the power source for the PFC to charge the DC link capacitor to the desired voltage level and has a sinusoidal value that is in proportion to the sufficient amount of power and that is offset by a zero voltage switching (ZVS) offset value, wherein the ZVS offset value is a value of reverse current in the inductor for which zero voltage switching of the power switches is ensured, and the first reference signal during negative half-cycles of the input voltage has the negative ZVS offset value, wherein the second reference signal during positive half-cycles of the input voltage has the ZVS offset value and during negative half-cycles of the input voltage has the negative sinusoidal value; and a hysteretic comparator circuit assembly configured to compare the inductor current with the first and second reference signals and to turn the first power switch off and the second power switch on upon the inductor current equaling the second reference signal and to turn the first power switch on and the second power switch off upon the inductor current equaling the first reference signal whereby the PFC charges the DC link capacitor to the desired voltage level with zero voltage switching of the power switches.

12. The on-board charger of claim 11 wherein:
the hysteretic comparator circuit assembly includes a first comparator which receives the first reference signal and a sensed value of the inductor current as inputs and switches its output upon the inductor current equaling the first reference signal; and
the hysteretic comparator circuit assembly further includes a second comparator which receives the second reference signal and the sensed value of the inductor current as inputs and switches its output upon the inductor current equaling the second reference signal.

13. The on-board charger of claim 12 wherein:
the hysteretic comparator circuit assembly further includes a digital flip-flop circuit and a digital driver circuit which function with the outputs of the first comparator and the second comparator to generate a first control signal such that the first power switch stays off and the second power switch stays on until the inductor current equals the first reference signal and to generate a second control signal such that the first power switch stays on and the second power switch stays off until the inductor current equals the second reference signal.

14. The on-board charger of claim 13 wherein:
the micro-controller is associated with first, second, and third signal conditioners, wherein the first signal conditioner is in communication with an input side of the PFC and senses the input voltage, the second signal conditioner is communication with a measuring resistor in series with the inductor and senses the inductor current, and the third signal conditioner senses a voltage of the DC link capacitor; and wherein the micro-controller processes the sensed voltage of the DC link capacitor, the sensed input voltage, and the desired voltage level of the DC link capacitor to generate the first reference signal and the second reference signal.

15. The on-board charger of claim 14 wherein:
the micro-controller generates each of the first reference signal and the second reference signal by (i) determining a voltage difference of the desired voltage of the DC link capacitor and the sensed voltage of the DC link capacitor, (ii) proportional integrating the voltage difference to generate a desired input current value, and (iii) multiplying the desired input current value and the sensed input voltage to generate a power signal indicative of the sufficient amount of power to be absorbed from the mains supply by the PFC for the PFC to charge the DC link capacitor to the desired voltage level.

16. The on-board charger of claim 15 wherein:
the micro-controller is further associated with a zero-crossing detector (ZCD) configured to generate a zero-crossing signal when the input crosses zero volts, wherein the first reference signal and the second reference signal are further generated based on the zero-crossing signal.

17. The on-board charger of claim 13 wherein:
the micro-controller is pre-configured with a magnitude of the reverse value of the inductor current.

18. The on-board charger of claim 13 further comprising:
a DC/DC converter to convert the desired voltage level of the DC link capacitor to a higher or lower voltage level and to charge the traction battery to the higher or lower voltage level.

19. The on-board charger of claim 11 wherein:
the first power switch and the second power switch are arranged in a totem-pole configuration with each of the first power switch, the second power switch, and the inductor being connected together at one end.

20. The on-board charger of claim 11 wherein:
the PFC further has a measuring resistor in series with the inductor; and
the micro-controller is in communication with the measuring resistor to sense the inductor current for the hysteretic comparator circuit assembly to use in comparing the inductor current with the first and second reference signals.

* * * * *